United States Patent
Ding et al.

(10) Patent No.: US 9,148,097 B2
(45) Date of Patent: Sep. 29, 2015

(54) ELECTRONIC SYSTEM—RADIO FREQUENCY POWER AMPLIFIER AND METHOD FOR DYNAMIC ADJUSTING BIAS POINT

(71) Applicant: ADVANCED SEMICONDUCTOR ENGINEERING INC., Kaohsiung (TW)

(72) Inventors: Jaw-Ming Ding, Hsinchu County (TW); Chien-Yeh Liu, Hsinchu County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 39 days.

(21) Appl. No.: 14/098,883

(22) Filed: Dec. 6, 2013

(65) Prior Publication Data
US 2014/0191806 A1    Jul. 10, 2014

(30) Foreign Application Priority Data
Jan. 4, 2013    (TW) .............................. 102100284 A

(51) Int. Cl.
| | | |
|---|---|---|
| H03G 3/10 | (2006.01) |
| H03F 3/04 | (2006.01) |
| H03F 3/191 | (2006.01) |
| H03F 1/02 | (2006.01) |

(52) U.S. Cl.
CPC .............. *H03F 3/191* (2013.01); *H03F 1/0266* (2013.01)

(58) Field of Classification Search
USPC ......................................... 330/285, 296, 288
IPC ....................................... H03G 3/10; H03F 3/04
See application file for complete search history.

(56) References Cited

U.S. PATENT DOCUMENTS

| | | | |
|---|---|---|---|
| 2002/0075076 A1* | 6/2002 | Sowlati ......................... | 330/296 |
| 2005/0285681 A1* | 12/2005 | Doherty et al. ............... | 330/297 |
| 2006/0114062 A1* | 6/2006 | Joly .............................. | 330/285 |
| 2007/0096823 A1* | 5/2007 | Wang et al. ................... | 330/285 |
| 2009/0085669 A1* | 4/2009 | Rohani et al. ................. | 330/296 |
| 2009/0153248 A1* | 6/2009 | Sun et al. ...................... | 330/264 |
| 2011/0128078 A1* | 6/2011 | Doherty et al. ............... | 330/285 |
| 2014/0354350 A1* | 12/2014 | Bowers et al. ................ | 327/564 |

* cited by examiner

*Primary Examiner* — Patricia T Nguyen
(74) *Attorney, Agent, or Firm* — Foley & Lardner LLP; Cliff Z. Liu; Angela D. Murch

(57) ABSTRACT

A radio frequency (RF) power amplifier is disclosed. The RF power amplifier includes a bias circuit, an output stage circuit and dynamic bias controlling circuit. The bias circuit receives a first system voltage and provides a working voltage accordingly. The output stage circuit receives the working voltage so as to work at an operation bias point. The dynamic bias controlling circuit detects a RF input signal and outputs a compensation voltage to the bias circuit according to variation of the RF input signal, wherein the dynamic bias controlling circuit is an open loop configuration. When an input power of the RF input signal increases and makes the working voltage decreases so as to shift the operation bias point, the bias circuit adjusts the working voltage upward so as to recover or enhance the operation bias point according to the compensation voltage received.

8 Claims, 6 Drawing Sheets

ELECTRONIC SYSTEM—RADIO FREQUENCY POWER AMPLIFIER AND METHOD FOR DYNAMIC ADJUSTING BIAS POINT

BACKGROUND OF THE INVENTION

1. Field of the Invention

The instant disclosure relates to a RF power amplifier; in particular, to a RF power amplifier capable of dynamically adjusting bias point.

2. Description of Related Art

With the Internet well developed, people are used to receiving mass information fast, especially because the wireless communication technology has developed in recent years and many kinds of personal mobile products are blooming such as the mobile phone, the Personal Digital Assistance (PDA) and the like, people tend to have the real-time on-line support in addition to capturing the real-time information. Therefore, the combination of the Internet, the Wireless Local Area Network (WLAN) regarding to the wireless communication and the 3rd-Generation (4G) and $4^{th}$-Generation (4G) mobile communication technologies becomes needed.

A RF power amplifier plays an extremely important role in the communication system. In order to have better Power Added Efficiency (PAE), a linear RF power amplifier usually prefers to the class AB operation. Generally speaking, when a RF input power increases, an average voltage drop of the forward biased junction of an amplification transistor decreases and the RF power amplifier is forced to the class B operation and even the class C operation, so that the output power of the amplification transistor becomes saturated and the output signal gradually becomes non-linear.

In other words, in a transmitter, the RF power amplifier is an element having the most power consumption, of which the Power Added Efficiency (PAE) directly affects the battery life. A direct current bias of the class AB can improve the Power Added Efficiency (PAE) of the power amplifier, because it has a lower level quiescent current, which is, the bias current with zero input power. However, when the input power of the amplifier increases to certain level, the load line used in the class AB amplifier may enter into a cut off region, which further results in a gain compression making the output power saturated. Since the direct current operating point is near the cut off region, when the output power of the class AB amplifier increases to certain level, the gain compression mechanism in the cut off region restricts the power gain and the output power of the class AB amplifier.

SUMMARY OF THE INVENTION

The instant disclosure provides a RF power amplifier, used for amplifying a RF input signal received. The RF power amplifier comprises a bias circuit, an output-stage circuit, and a dynamic bias controlling circuit. The bias circuit receives a first system voltage, and provides a work voltage according to the first system voltage. The output-stage circuit is electrically connected to the bias circuit and receives the work voltage so as to operate at an operation bias point. The dynamic bias controlling circuit is electrically connected between the bias circuit and the output-stage circuit. The dynamic bias controlling circuit detects the RF input signal and outputs a compensation voltage to the bias circuit according to a change of the RF input signal. When an input power of the RF input signal increases such that the operation bias point offsets and the work voltage decreases, the work voltage is increased by the bias circuit according to the compensation voltage received so as to recover or elevate the operation bias point.

In an embodiment of the instant disclosure, the bias circuit comprises a first transistor, a second transistor, a first reference resistor, a first resistor, and a second resistor. An emitter of the first transistor is connected to a ground voltage, and a base of the first transistor is connected to the dynamic bias controlling circuit for receiving a compensation voltage. A base of the second transistor is connected to a collector of the first transistor, and a collector of the second transistor is connected to the first system voltage. One terminal of the first reference resistor is connected to the first system voltage, and another terminal of the first reference resistor is connected to the base of the second transistor, wherein the first reference resistor is used for generating a first reference current. One terminal of the first resistor is connected to an emitter of the second transistor, and another terminal of the first resistor is connected to the base of the first transistor. One terminal of the second resistor is connected to the emitter of the second transistor, and another terminal of the second resistor is connected to the output-stage circuit and outputs the work voltage. The first reference current is equal to sum of the collector current of the first transistor and the base current of the second transistor In an embodiment of the instant disclosure, when the input power of the RF input signal increases, the base of the first transistor receives the compensation voltage corresponding, and accordingly the base current and the collector current of the first transistor decrease such that the base current and the emitter current of the second transistor increase, so as to increase the work voltage for recovering or elevating the operation bias point In an embodiment of the instant disclosure, the output-stage circuit comprises a third transistor. A base of the third transistor receives the work voltage, an emitter of the third transistor is connected to the ground voltage, and a collector of the third transistor is connected to a second system voltage. In an AC signal mode, the third transistor is used for amplifying the RF input signal received and outputs a RF output signal at the collector of the third transistor itself.

In an embodiment of the instant disclosure, the dynamic bias controlling circuit comprises a second reference resistor, a third resistor, a fifth resistor, a fourth resistor, and a first capacitor. One terminal of the second reference resistor is connected to the first system voltage, and another terminal of the second reference resistor is connected to a collector of the fourth transistor. The collector of the fourth transistor is connected to another terminal of the second reference resistor, an emitter of the fourth transistor is connected to the ground voltage, a base of the fourth transistor receives the RF input signal and detects a change of the RF input signal, and the fourth transistor is served as a power detecting transistor. One terminal of the third transistor is connected to one terminal of the second resistor, and another terminal of the third resistor is connected to the base of the fourth transistor. One terminal of the fifth resistor is connected to another terminal of the third resistor, and another terminal of the fourth resistor outputs the compensation voltage. One terminal of the first capacitor is connected to another terminal of the fifth resistor, and another terminal of the first capacitor is connected to the ground voltage. The resistance value of the first reference resistor is equal to the resistance value of the second reference resistor, and the fifth resistor and the first capacitor is used for filtering high frequency signal in the AC signal mode.

In an embodiment of the instant disclosure, the resistance value of the first resistor is equal to the resistance value of the third resistor.

The instant disclosure further provides an electronic system. The electronic system comprises a RF power amplifier and a load. The RF power amplifier receives a RF input signal and outputs a RF output signal. The load is connected to the RF power amplifier and receives the RF output signal. When the input power of the RF input signal increases, the RF power amplifier stabilizes the operation bias point via a compensation circuit.

The instant disclosure further provides a method for dynamic adjusting bias point. The method for dynamic adjusting bias point comprises the steps as below: receiving a system voltage and accordingly providing a work voltage via a bias circuit; receiving the work voltage and accordingly operating at an operation bias point via an output-stage circuit; and detecting input power of a RF input signal and outputting a compensation voltage for stabilizing the operation bias point according to change of input power via a dynamic bias controlling circuit. Particularly, the method for dynamic adjusting bias point is used for the RF power amplifier or the electronic system mentioned above.

To sum up, in the electronic system, the RF power amplifier, and the method for dynamic adjusting bias point provided by the instant disclosure, when the input power increases, a gain compression resulted from the situation that the bias point of the RF power amplifier enters into a cut-off region is avoided so as to prevent the output power from saturating. In other words, the embodiment of the instant disclosure can dynamically adjust the operation bias point of the RF power amplifier so as to decrease the off-set of the operation bias point with a change of the input power. Further, the embodiment of the instant disclosure can improve the linearity of the RF power amplifier during the power transformation so as to decrease the signal distortion and provide more extended ranges of the input power and the output power in order to be satisfied with the linearity required by the system.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the present disclosure. As used herein, the term "and/or" includes any and all combinations of one or more of the associated listed items.

[One Embodiment of a RF Power Amplifier]

Figure 1:
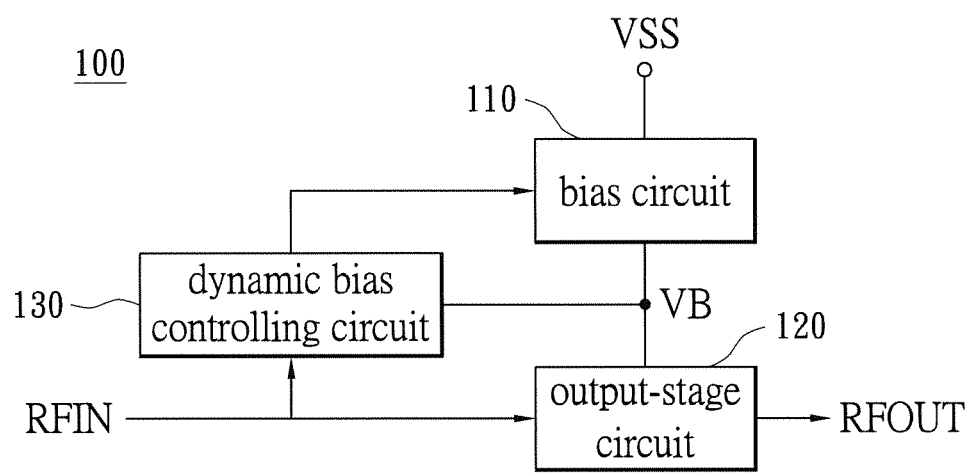
FIG. 1 shows a circuit diagram of a schematic block diagram of a RF power amplifier according to an embodiment of the instant disclosure.

Please refer to FIG. 1. FIG. 1 shows a circuit diagram of a schematic block diagram of a RF power amplifier according to an embodiment of the instant disclosure. As shown in FIG. 1, a RF power amplifier 100 comprises a bias circuit 110, an output-stage circuit 120 and a dynamic bias controlling circuit 130. The bias circuit 110 is electrically connected to the output-stage circuit 120. The dynamic bias controlling circuit 130 is electrically connected to the bias circuit 110.

In the present embodiment, the bias circuit 110 receives a first system voltage VSS, and the bias circuit 110 provides a work voltage VB according to the first system voltage VSS. The output-stage circuit 120 receives the work voltage VB so as to work at an operation bias point. The dynamic bias controlling circuit 130 is used for detecting a RF input signal RFIN, and output a compensation voltage VC to the bias circuit 110 according to a change of the RF input signal RFIN. When the input power of the RF input signal RFIN increases such that the operation bias point of the output-stage circuit 120 offsets and the work voltage decreases, the work voltage VB is increased by the bias circuit 110 to recover or elevate the operation bias point of the output-stage circuit according to the compensation voltage VC received.

In the following description is further instruction in teaching a work mechanism of the RF power amplifier 100.

Please still refer to FIG. 1. In a wireless communication system, the RF power amplifier 100 is used for increasing the output power of a transmitter, and thus the RF power amplifier 100 has to, with a limited power consumption, provide the output power with a high working efficiency and a high linearity required by the system. In a DC operation mode, the bias circuit 110 generates a work voltage VB via an electrical connection with the first system voltage VSS, and the RF power amplifier 100 is operated at an operation bias point via the work voltage VB provided by the bias circuit 110. In an AC operation mode, after the output-stage circuit 120 receives and amplifies a RF input signal RFIN, the output-stage circuit 120 outputs a RF output signal (RFOUT). However, when the input power of the RF input signal RFIN becomes larger and larger, the work voltage VB of the output-stage circuit 120 decreases gradually, which further results in a gain compression because the operation bias point of the output-stage circuit 120 enters into a cut-off region. The gain compression may make the overall output power of the RF power amplifier 100 saturated and thus decrease the working efficiency and the linearity of the RF power amplifier 100.

Thus, in the present embodiment, the RF power amplifier 100 stabilizes the operation bias point of the output-stage circuit 120 via the dynamic bias controlling circuit 130. Furthermore, the instant disclosure receives and detects a change of the input power of the RF input signal RFIN via the dynamic bias controlling circuit 130. When the input power of the RF input signal RFIN increases such that the work voltage VB decreases gradually, the dynamic bias controlling circuit 130 synchronously detects a change of the work voltage VB and further generates a compensation voltage VC to the bias circuit 110 so as to adjust the work voltage VB outputted by the bias circuit 110. Afterwards, the work voltage VB is increased by the bias circuit 110 so as to recover or elevate the operation bias point of the output-stage circuit 120 according to the compensation voltage VC received.

Accordingly, via the mechanism for dynamically adjusting operation bias point, the operation bias point of the RF power amplifier 100 does not offset into a cut off region with the increase of the input power of the RF input signal and there is no gain compression resulted. In other words, the instant disclosure can dynamically self-adjust the operation bias point of the RF power amplifier 100 so as to decrease the offset of the operation bias point with the change of the input power. The embodiment of the instant disclosure improves the linearity of the RF power amplifier 100 during the power transformation so as to decrease the signal distortion in order to provide a high working efficiency and a high linearity that required by the system.

For a specific instruction on an operation process of the RF power amplifier 100 of the instant disclosure, there is at least one of the embodiments for further instruction.

In the following embodiments, there are only parts different from embodiments in FIG. 1 described, and the omitted parts are indicated to be identical to the embodiments in FIG. 1. In addition, for an easy instruction, similar reference numbers or symbols refer to elements alike.

[Another Embodiment of a RF Power Amplifier]

Figure 2:
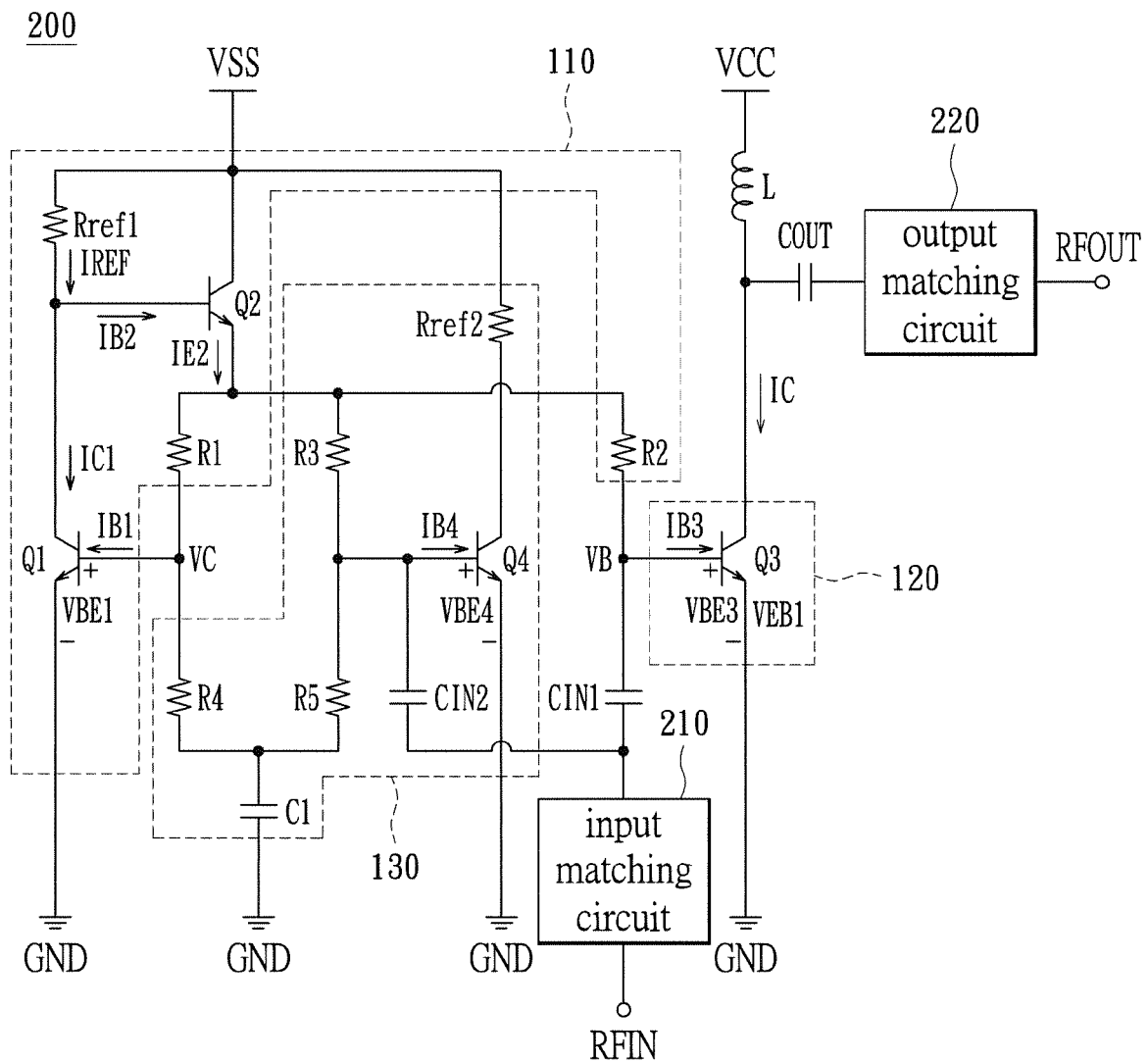
FIG. 2 shows a perspective diagram of a detailed circuit diagram of a RF power amplifier according to an embodiment of the instant disclosure.

Please refer to FIG. 2. FIG. 2 shows a perspective diagram of a detailed circuit diagram of a RF power amplifier according to an embodiment of the instant disclosure. Different from the embodiment in FIG. 1, in the present embodiment, the bias circuit 110 comprises a first transistor Q1, a second transistor Q2, a first reference resistor Rref1, a first resistor R1, and a second resistor R2. The output-stage circuit 120 comprises a third transistor Q3. The dynamic bias controlling circuit 130 comprises a second reference resistor Rref2, a fourth transistor Q4, a third resistor R3, a fourth resistor R4, a fifth resistor R5, and a first capacitor C1. In the present embodiment, the transistors Q1~Q4 are NPN transistors, while in another embodiment, the transistors Q1~Q4 may be consisted of any kind of transistors which are with a gallium arsenide manufacture process, a silicon manufacture process or a silicon germanium manufacture process such as effect transistors (FET), heterojunction bipolar transistors (HBT), or bipolar field effect transistors (BiFET), and thus it is not limited thereto.

An emitter of the first transistor Q1 is connected to the ground voltage GND, and a base of the first transistor Q1 is connected to the dynamic bias controlling circuit 130 so as to receive a compensation voltage VC. A base of the second transistor Q2 is connected to the collector of the first transistor Q1, and the collector of the second transistor Q2 is connected to a first system voltage VSS. One terminal of the first reference resistor Rref1 is connected to the first system voltage VSS, and another terminal of the first reference resistor Rref1 is connected to the base of the second transistor Q2. Particularly, the first reference resistor Rref1 is used for generating a first reference current IREF. One terminal of the first resistor R1 is connected to the emitter of the second transistor Q2, and another terminal of the first resistor R1 is connected to the base of the first transistor Q1. One terminal of the second resistor R2 is connected to the emitter of the second transistor Q2, and another terminal of the second resistor R2 is connected to the output-stage circuit 120 and outputs a work voltage VB. The first reference current IREF is equal to sum of the collector current of the first transistor Q1 and the base current of the second transistor Q2. A base of the third transistor Q3 receives the work voltage VB, an emitter of the third transistor Q3 is connected to the ground voltage GND, and a collector of the third transistor Q3 is connected to a second system voltage VCC. In the AC signal mode, the third transistor Q3 is used for amplifying the RF input signal RFIN received and a RF output signal RFOUT is outputted at a collector of the third transistor Q3. One terminal of the second reference resistor Rref2 is connected to the first system voltage VSS, and another terminal of the second reference resistor Rref2 is connected to a collector of the fourth transistor Q4. The collector of the fourth transistor Q4 is connected to another terminal of the second reference resistor Rref2, an emitter of the fourth transistor Q4 is connected to the ground voltage GND, and a base of the fourth transistor Q4 receives a RF input signal RFIN and is used for detecting a change of the RF input signal RFIN. Particularly, the fourth transistor Q4 is served as a power detecting transistor. One terminal of the third resistor R3 is connected to one terminal of the second resistor R2, and another terminal of the third resistor R3 is connected to the base of the fourth transistor Q4. One terminal of the fourth resistor R4 is connected to another terminal of the first resistor R1 and outputs a compensation voltage VC. One terminal of the fifth resistor R5 is connected to another terminal of the third resistor R3, and another terminal of the fifth resistor R5 is connected to another terminal of the fourth resistor R4. One terminal of the first capacitor C1 is connected to another terminal of the fourth resistor R4, and another terminal of the first capacitor C1 is connected to the ground voltage GND. The resistance value of the first reference resistor Rref1 is equal to the resistance value of the second reference resistor Rref2, and the fourth resistor R4, the fifth resistor R5 and the first capacitor C1 are used for filtering high frequency signals in an AC signal mode. Herein, it is worth mentioning that, in another embodiment, there is merely the fifth resistor R5 (which means the resistance value of the fourth resistor R4 is zero), and one terminal of the fifth resistor R5 is connected to another terminal of the third resistor R3 and another terminal of the fifth resistor R5 outputs a compensation voltage VC. Besides, one terminal of the first capacitor C1 is connected to another terminal of the fifth resistor R5, and another terminal of the first capacitor C1 is connected to the ground voltage GND. Particularly, the fifth resistor R5 and the first capacitor C1 can filter high frequency signals in an AC signal mode.

In addition, in the circuit topology configurations of transistors disclosed in FIG. 2, when an emitter area of the third transistor Q3 is N times of an emitter area of the first transistor Q1, the resistance value of the second resistor R2 is N times of the resistance value of the first resistor R1, and the output current IC of the third transistor Q3 is N times of the first reference current IREF, in which N is—greater than 1. The designer determines the value of N according to a circuit designing demand or an actual application demand. Further, in the present embodiment, the input terminal and the output terminal of the output-stage circuit 120 have an input matching circuit 210 and an output matching circuit 220 respectively, so as to provide a higher power matching efficiency, in which the input matching circuit 210 is electrically connected to a base of the third transistor Q3 to receive a RF input signal RFIN, and the output matching circuit 220 is electrically connected to a collector of the third transistor Q3 to output a RF output signal RFOUT.

In the following description is further instruction in teaching a work mechanism of a RF power amplifier 200.

Please still refer to FIG. 2, in the wireless communication system, the RF power amplifier 200 is usually one of the most important core elements, and the linearity and the power efficiency thereof have a decisive effect on the performance and the efficiency of the wireless communication system. The RF power amplifier 200 may be a simple amplifier mainly consisted of an active element to amplify signals and matching circuits of the input terminal and the output terminal to elevate the modulated signals to a proper high level, in which the modulated signals are transmitted afterwards. When the transmitted signals arrive at a receiving terminal via an electric wave transmitting medium, the signal intensity is enough to provide recovery signals for the receiving terminal.

In the present embodiment, in a DC operation mode, the bias circuit 110 consisted of a first transistor Q1, a second transistor Q2, a first resistor R1, a second resistor R2 and a first reference resistor Rref1 generates a work voltage VB and provides the work voltage VB to a base of the third transistor Q3. It is noticed that, at this time, the direct voltage level of the work voltage VB is equal to the base-emitter voltage VBE3 of the third transistor Q3. It is worth mentioning that, the first reference resistor Rref1 is equal to the second reference resistor Rref2, the first resistor R1 is equal to the third resistor R3, and thus the bias in the DC operation mode is not affected because of such a circuit structure with the symmetry. After entering into an AC operation mode, the base of the third transistor Q3 receives a RF input signal RFIN via the input match circuit 210, and amplifies the RF input signal RFIN received so as to output a RF output signal RFOUT. The fourth transistor Q4, served as a power detecting transistor, a base of which also receives the RF input signal RFIN via the input match circuit 210 and a capacitor CIN2. It is noticed that, in the present embodiment, the base-emitter voltage VBE4 of the fourth transistor Q4 is equal to the base-emitter voltage VBE3 of the third transistor Q3.

When the input power of the RF input signal RFIN gradually increases, the base-emitter voltages VBE3 and VBE4 and the work voltage VB decrease gradually, and the base current IB3 also decreases, which further results in an offset of the operation bias point of the third transistor Q3 towards cut off region during a transient process. In the present embodiment, the work voltage VB is increased by the RF power amplifier 200 so as to recover the operation bias point of the third transistor Q3 mainly via the dynamic bias controlling circuit 130. Further, because the dynamic bias controlling circuit 130 of the instant disclosure is an open loop configuration, the RF power amplifier 200 is more capable of increasing the work voltage VB via the dynamic bias controlling circuit 130 so as to elevate the operation bias point of the third transistor Q3. In addition, the fourth transistor Q4 in the dynamic bias controlling circuit 130 is mainly used for detecting a change of the input power, and when the input power of the RF input signal RFIN increases, the base-emitter voltage VBE4 of the fourth transistor Q4 and the base current IB4 both decrease. The fourth resistor R4, the fifth resistor R5 and the first capacitor C1 play roles to filter high frequency signals so as to make a change of the input power corresponding to one terminal of the fourth resistor R4. While, it is clarified that, in another embodiment, it is sufficient to use the fifth resistor R5 merely, which has no effect on filtering high frequency signals, which is one of advantages of the instant disclosure. One terminal of the fourth resistor R4 outputs a compensation voltage VC to the base of the first transistor Q1. It is worth mentioning that, the compensation voltage VC mentioned herein is equal to the base-emitter voltage VBE1 of the first transistor Q1, and a decrease of the base current IB4 and the base-emitter voltage VBE4 of the fourth transistor Q4 makes the base current IB1 and the base-emitter voltage VBE1 of the first transistor Q1 decrease synchronously.

For the transistors Q1~Q4, there is an identical relation of the current, that is, the base current multiplied by the current gain β is the collector current. Therefore, in the first transistor Q1, when the base current IB1 decreases, the collector current IC1 decreases. Afterwards, in the present embodiment, the first reference current IREF generated by the first reference resistor Rref1 is constant, so when the collector current IC1 of the first transistor Q1 decreases, the base current IB2 of the second transistor Q2 increases. It is clarified that, for the transistors Q1~Q4, there is another identical relation of the current, that is, the collector current is equal to sum of the base current and the collector current. Thus, in the second transistor Q2, when the base current IB2 of the second transistor Q2 increases, the emitter current IE2 of the second transistor Q2 increases. Thus, part of the emitter current IE2 flows through the second resistor R2 and the third resistor R3, which further increases the work voltage VB of the third transistor Q3 provided by the bias circuit 110. Particularly, the base-emitter voltages VBE3 and VBE4 are also elevated synchronously and equal to voltage value of the work voltage VB. Accordingly, the instant disclosure dynamically adjusts the work voltage VB via a feedback mechanism of the RF power amplifier 200 so as to maintain the high linearity required by the RF power amplifier 200, in other words, the RF power amplifier 200 can still stabilize the operation bias point of the third transistor Q3 even with a change of the input power.

There is at least one stimulation waveform regarding to the embodiment shown in FIG. 2 for a further instruction.

Figure 3:
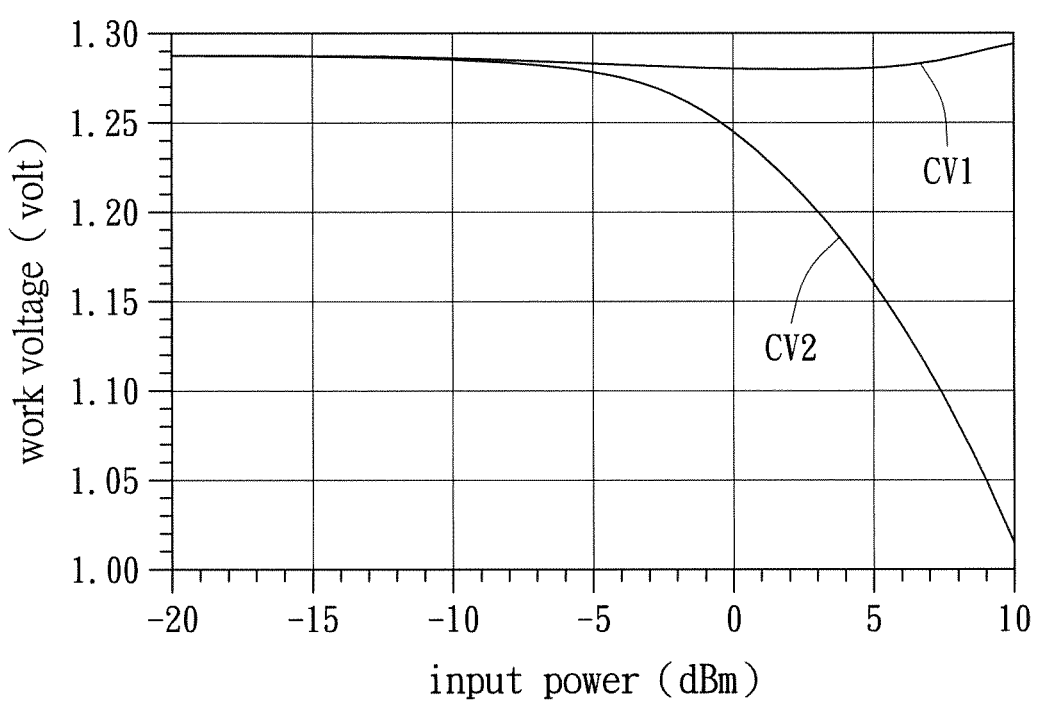
FIG. 3 shows a simulation waveform of a relationship between an input power and a work voltage according to an embodiment of the instant disclosure.

In conjunction with FIGS. 2 and 3, FIG. 3 shows a simulation waveform of a relationship between an input power and a work voltage according to an embodiment of the instant disclosure. In the simulation waveform of FIG. 3, a horizontal axis represents the input power, whose unit is dBm, and a vertical axis represents the woke voltage, whose unit is volt, in which the a curve CV1 is the simulated curve of the embodiment shown in FIG. 2 and a curve CV2 is a simulated curve without the dynamic bias controlling circuit 130 shown in FIG. 2. As shown in FIG. 3, when the input power of the RF input signal RFIN gradually increases, the curve CV2 has a tendency to decrease. However, the dynamic bias controlling circuit 130 is an open loop configuration, so the curve CV1 does not decrease but has a slight tendency to increase. Accordingly, the RF power amplifier 200 of the instant disclosure can recover and even elevate the operation bias point so as to be more satisfied with a high linearity required of the RF power amplifier 200. Additionally, the RF power amplifier 200 with the dynamic bias controlling circuit 130 can dramatically reduces the probability that the operation bias point enters into a cut-off region.

Afterwards, for specific instruction of relevant details of the advantages of the instant disclosure, there is further instruction along with another wave form regarding to the input power and the output current. In conjunction with FIGS.

Figure 4:
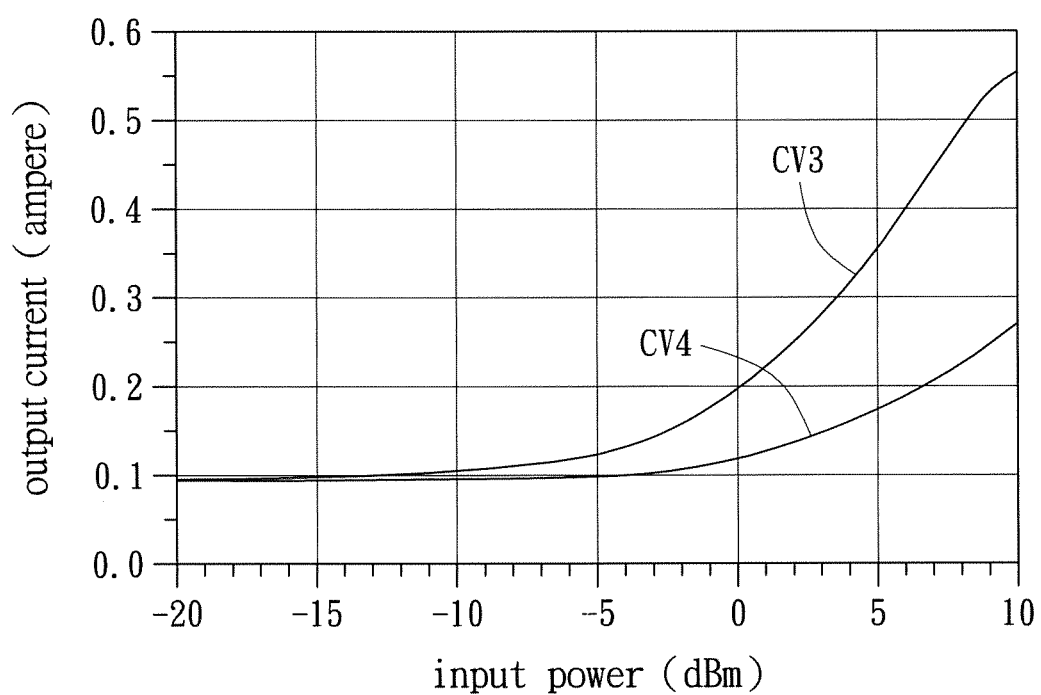
FIG. 4 shows a simulation waveform of a relationship between an input power and a output current according to an embodiment of the instant disclosure.

2 and 4, FIG. 4 shows a simulation waveform of a relationship between an input power and a output current according to an embodiment of the instant disclosure. In the stimulation waveform of FIG. 4, a horizontal axis represents the input power, whose unit is dBm, and a vertical axis represents the output current, whose unit is ampere, in which the a curve CV3 is the simulated curve of the embodiment shown in FIG. 2 and a curve CV4 is a simulated curve without the dynamic bias controlling circuit 130 shown in FIG. 2. As shown in FIG. 4, when the input power of the RF input signal RFIN gradually increases, the increase of the curve CV3 is more than the increase of the curve CV4, and thus with the dynamic bias controlling circuit 130 the RF power amplifier 200 can maintain a high working efficiency and a high linearity.

Figure 5:
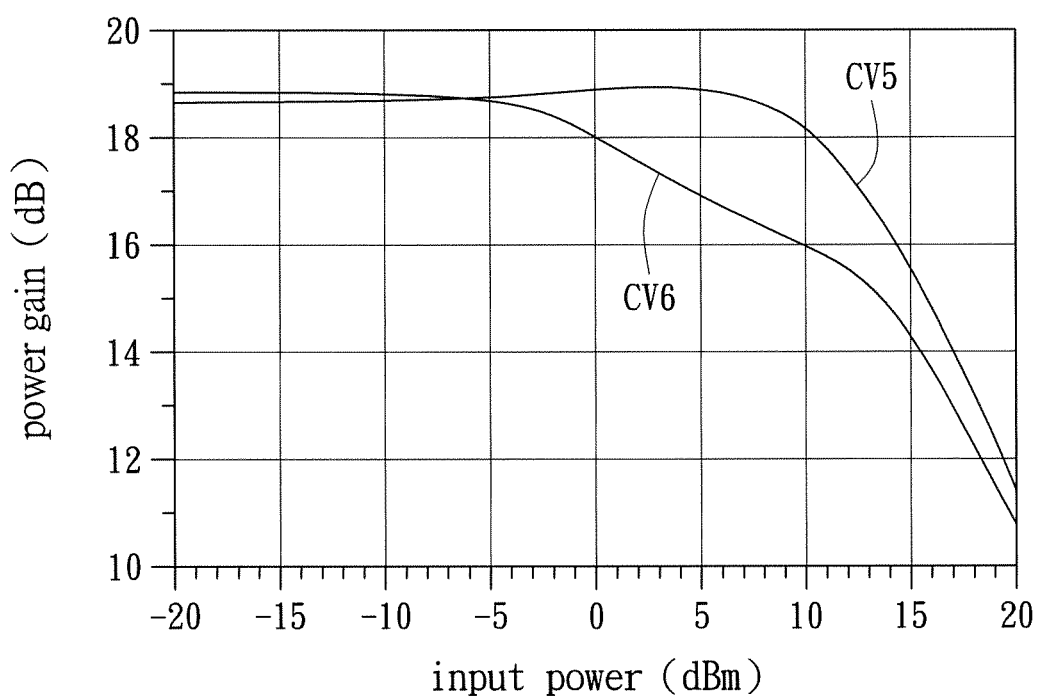
FIG. 5 shows a simulation waveform of a relationship between an input power and a power gain according to an embodiment of the instant disclosure.

Last but not the least, this embodiment further provides a simulation waveform regarding to the input power and the power gain for a further instruction of the advantages of the instant disclosure. In conjunction with FIGS. 2 and 5, FIG. 5 shows a simulation waveform of a relationship between an input power and a power gain according to an embodiment of the instant disclosure. In the simulation waveform of FIG. 5, a horizontal axis represents the input power, whose unit is dBm, and a vertical axis represents the power gain, whose unit is dB, in which the curve CV5 is the simulated curve of the embodiment shown in FIG. 2 and a curve CV6 is a simulated curve without the dynamic bias controlling circuit 130 shown in FIG. 2. Herein, it is clarified that, the power gain is a value of the output power of the third transistor Q3 divided by the input power of the third transistor Q3. As shown in FIG. 5, when the input power of the RF input signal RFIN gradually increases, the power gain regarding to the curve CV5 is better maintained and more stable than the power gain shown by the curve CV6. Thus, when the input power of the RF input signal RFIN gradually increases, the RF power amplifier 200 of this embodiment still can maintain a high linearity required by the system.

In addition, in one embodiment of the instant disclosure, the output-stage circuit 120 further comprises an inductor L, and capacitors CIN1 and COUT. One terminal of the capacitor CIN1 is connected to a base of the third transistor Q3, and another terminal of the capacitor CIN1 is connected to a RF input signal RFIN. The inductor L is connected between a second system voltage VCC and a collector of the third transistor Q3. One terminal of the capacitor COUT is connected to the collector of the third transistor Q3, and another terminal of the capacitor COUT outputs a RF output signal RFOUT.

When the RF power amplifier 200 has not yet received the RF input signal RFIN, the inductor L shows a low-impedance state, such as a short circuit, to a DC signal, while the capacitors CIN1 and COUT show a high-impedance state, such as an open circuit, to a DC signal. When the RF power amplifier 200 starts to receive the RF input signal RFIN, the inductor L shows a high-impedance state, such as an open circuit, to high frequency signal; while the capacitors CIN1 and COUT show a low-impedance state, such as a short circuit, to high frequency signal. Accordingly, the RF power amplifier 200 operates smoothly in both of the DC working mode and the AC working mode.

[One Embodiment an Electric System]

Figure 6:
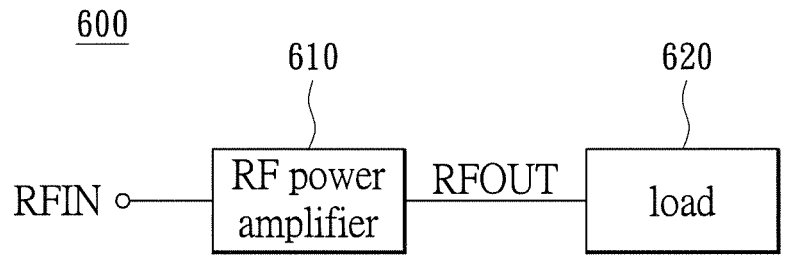
FIG. 6 shows a circuit diagram of a schematic block diagram of an electric system according to an embodiment of the instant disclosure.

Please refer to FIG. 6. FIG. 6 shows a circuit diagram of a schematic block diagram of an electric system according to an embodiment of the instant disclosure. The electric system 600 comprises a RF power amplifier 610 and a load 620. The RF power amplifier 600 receives a RF input signal RFIN and outputs a RF output signal RFOUT to the load 620, in other words, after the RF power amplifier 610 is connected to the system voltage, it provides a stable output power to the load 620. The RF power amplifier 610 which provides a stable output power for the load could be the RF power amplifier 100 of the embodiment shown in FIG. 1 or the RF power amplifier 200 of the embodiment shown in FIG. 2. The electric system 600 may be a system inside any kind of electric devices, such as a portable device, a mobile device and the like.

[One Embodiment of a Method for Self-Adjusting Bias Point]

Figure 7:
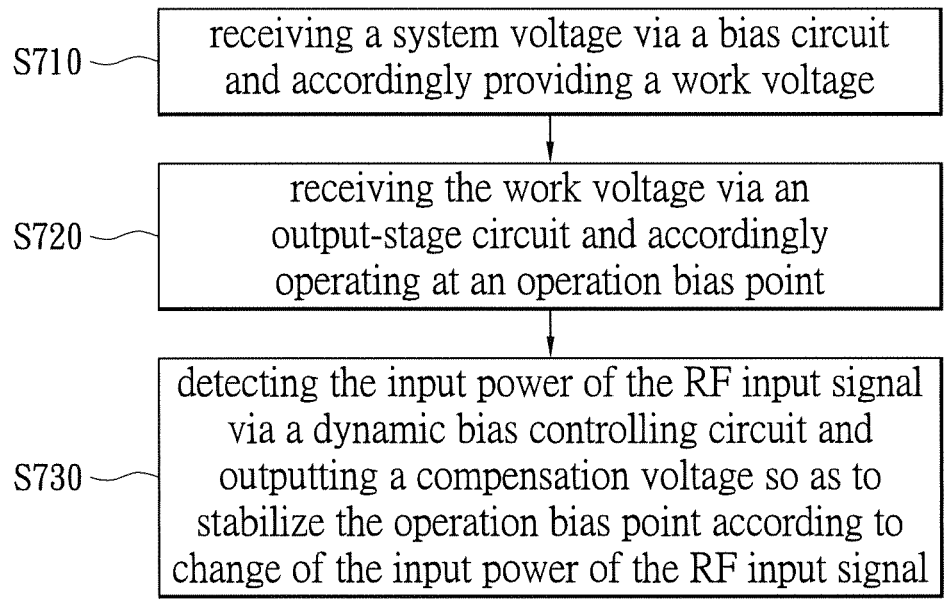
FIG. 7 shows a flow chart of a method for self-adjusting bias point according to an embodiment of the instant disclosure.

Please refer to FIG. 7. FIG. 7 shows a flow chart of a method for self-adjusting bias point according to an embodiment of the instant disclosure. The method of this embodiment may be conducted in the RF power amplifiers shown in FIGS. 1 and 2, and thus please refer to FIGS. 1 and 2 for further understanding. The method for self-adjusting bias point include steps as follows: receiving a system voltage via a bias circuit and accordingly providing a work voltage (S710); receiving the work voltage via an output-stage circuit and accordingly operating at an operation bias point (S720); and detecting the input power of the RF input signal via a dynamic bias controlling circuit and outputting a compensation voltage so as to stabilize the operation bias point according to change of the input power of the RF input signal (S730). When the input power of the RF input signal increases such that the operation bias point offsets and the work voltage decreases, the bias circuit increases the work voltage according to the compensation voltage received as so to recover or elevate the operation bias point.

As for the relevant details of the steps of the method for self-adjusting bias point, there is detailed instruction in the embodiments of the FIGS. 1 and 2, and thus it is not repeated thereto. It is to be clarified that a sequence of the steps of the embodiment in FIG. 7 is simply for a need to easily instruct, and the sequence of the steps is not used as a limit condition in demonstrating the embodiments of the instant disclosure.

To sum up, in the electronic system, the RF power amplifier, and the method for self-adjusting bias point provided by the instant disclosure, when the input power of the RF input signal increases, the gain compression resulted from the fact that the operation bias point of the RF power amplifier offsets into a cut off region can be avoided so as to prevent the output power from being saturated. In other words, the instant disclosure dynamically controls the operation bias point of the RF power amplifier so as to decrease the offset resulted from a change of the input power.

In at least one of the embodiments of the instant disclosure, the work voltage can be increased by the RF power amplifier via a dynamic bias controlling circuit so as to recover or elevate the operation bias point of the third transistor.

At least one of the embodiments of the instant disclosure can improve the linearity of the RF power amplifier during the power transformation so as to decrease the signal distortion and provide a high working efficiency and a high linearity in order to be satisfied with the system requirements.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An RF power amplifier, configured for amplifying a received RF input signal, the RF power amplifier comprising:
   a bias circuit, configured to receive a first system voltage and to provide a work voltage according to the first system voltage;

an output-stage circuit, electrically connected to the bias circuit, the output-stage circuit configured to receive the work voltage so as to operate at an operation bias point; and a dynamic bias controlling circuit, electrically connected between the bias circuit and the output-stage circuit, the dynamic bias controlling circuit configured to detect the RF input signal and to output a compensation voltage to the bias circuit according to a change of the RF input signal;

wherein the bias circuit comprises:

a first transistor, having an emitter connected to a ground voltage, and having a base connected to the dynamic bias controlling circuit for receiving the compensation voltage;

a second transistor, having a base connected to a collector of the first transistor, and having a collector connected to the first system voltage;

a first reference resistor, having one terminal connected to the first system voltage, and having another terminal connected to the base of the second transistor, wherein the first reference resistor is configured for generating a first reference current;

a first resistor, having one terminal connected to an emitter of the second transistor, and having another terminal connected to the base of the first transistor; and a second resistor, having one terminal connected to the emitter of the second transistor, and having another terminal connected to the output-stage circuit and configured to output the work voltage;

wherein the first reference current is equal to a sum of a collector current of the first transistor and a base current of the second transistor; and wherein, when an input power of the RF input signal increases such that the operation bias point offsets and the work voltage decreases, the work voltage is increased by the bias circuit according to the compensation voltage received so as to recover or elevate the operation bias point.

2. The RF power amplifier according to claim 1, wherein, when the input power of the RF input signal increases, the base of the first transistor receives the compensation voltage, and accordingly a base current and the collector current of the first transistor decrease such that the base current and an emitter current of the second transistor increase, so as to increase the work voltage for recovering or elevating the operation bias point.

3. The RF power amplifier according to claim 1, wherein the output-stage circuit comprises:

a third transistor, having a base receiving the work voltage, having an emitter connected to the ground voltage, and having a collector connected to a second system voltage;

wherein in an AC signal mode, the third transistor is configured to amplify the RF input signal and to output an RF output signal at the collector of the third transistor.

4. The RF power amplifier according to claim 1, wherein the dynamic bias controlling circuit comprises:

a fourth transistor, having a an emitter connected to the ground voltage, and having a base configured to receive the RF input signal and detect a change of the RF input signal, the fourth transistor configured as a power detecting transistor;

a second reference resistor, having one terminal connected to the first system voltage, and having another terminal connected to a collector of the fourth transistor;

a third resistor, having one terminal connected to the one terminal of the second resistor, and having another terminal connected to the base of the fourth transistor;

a fifth resistor, having one terminal connected to the another terminal of the third resistor, and having another terminal outputting the compensation voltage; and a first capacitor, having one terminal connected to the another terminal of the fifth resistor, and having another terminal connected to the ground voltage;

wherein a resistance value of the first reference resistor is equal to a resistance value of the second reference resistor; and wherein the fifth resistor and the first capacitor are configured for filtering high frequency signals in an AC signal mode.

5. The RF power amplifier according to claim 4, wherein the resistance value of the first resistor is equal to a resistance value of the third resistor.

6. An electronic system, comprising: an RF power amplifier, configured for outputting an RF output signal to a load, the RF power amplifier comprising:

a bias circuit, configured to receive a first system voltage, and configured to provide a work voltage according to the first system voltage;

an output-stage circuit, electrically connected to the bias circuit, the output-stage circuit configured to receive the work voltage so as to operate at an operation bias point; and a dynamic bias controlling circuit, electrically connected between the bias circuit and the output-stage circuit, the dynamic bias controlling circuit configured to detect an RF input signal and to output a compensation voltage to the bias circuit according to a change of the RF input signal;

wherein the bias circuit comprises:

a first transistor, having an emitter connected to a ground voltage, and having a base connected to the dynamic bias controlling circuit for receiving the compensation voltage;

a second transistor, having a base connected to a collector of the first transistor, and having a collector connected to the first system voltage;

a first reference resistor, having one terminal connected to the first system voltage, and having another terminal connected to the base of the second transistor, wherein the first reference resistor is configured for generating a first reference current;

a first resistor, having one terminal connected to an emitter of the second transistor, and having another terminal connected to the base of the first transistor; and a second resistor, having one terminal connected to the emitter of the second transistor, and having another terminal connected to the output-stage circuit and configured to output the work voltage;

wherein the first reference current is equal to a sum of a collector current of the first transistor and a base current of the second transistor; and wherein the RF power amplifier is configured to stabilize the operation bias point when an input power of the RF input signal increases.

7. A method for dynamically adjusting a bias point, comprising:

receiving a system voltage and accordingly providing a work voltage via a bias circuit;

receiving the work voltage and accordingly operating at an operation bias point via an output-stage circuit; and detecting an input power of an RF input signal and outputting a compensation voltage for stabilizing the operation bias point according to a change of the input power;
wherein the method for dynamically adjusting the bias point is configured for the RF power amplifier according to claim 1 or the electronic system according to claim 6.

8. The method for dynamically adjusting bias point according to claim 7, wherein when the input power of the RF input signal increases such that the operation bias point offsets and the work voltage decreases, the work voltage is increased by the bias circuit according to the compensation voltage received so as to recover or elevate the operation bias point.

* * * * *